(12) United States Patent
Hao

(10) Patent No.: US 9,011,602 B2
(45) Date of Patent: Apr. 21, 2015

(54) PIN LIFTING SYSTEM

(75) Inventor: Fangli J. Hao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 1253 days.

(21) Appl. No.: 12/361,794

(22) Filed: Jan. 29, 2009

(65) Prior Publication Data

US 2010/0187777 A1   Jul. 29, 2010

(51) Int. Cl.
*H01L 21/67* (2006.01)
*C23C 16/458* (2006.01)
*H01L 21/683* (2006.01)
*H01L 21/687* (2006.01)

(52) U.S. Cl.
CPC ........ *H01L 21/6831* (2013.01); *C23C 16/4583* (2013.01); *C23C 16/458* (2013.01); *H01L 21/67* (2013.01); *H01L 21/687* (2013.01); *Y10T 279/34* (2013.01); *Y10T 279/23* (2013.01); *H01L 21/68742* (2013.01)

(58) Field of Classification Search
CPC .............. C23C 16/4583; C23C 16/458; H01L 21/6831; H01L 21/67
USPC .................. 279/142, 128; 118/715, 728, 729; 156/345.51; 269/142, 128, 13
See application file for complete search history.

(56) References Cited

U.S. PATENT DOCUMENTS 5,796,066 A * 8/1998 Guyot ...................... 219/121.48
5,848,670 A * 12/1998 Salzman ....................... 187/272
6,148,762 A * 11/2000 Fukuda et al. ................ 118/715
6,305,677 B1 * 10/2001 Lenz ............................... 269/13
2003/0205329 A1 * 11/2003 Gujer et al. .............. 156/345.51
2007/0089672 A1    4/2007 Shimamura et al.

FOREIGN PATENT DOCUMENTS

JP        10-308348      11/1998
JP        11-204430       7/1999
JP       2008270721 A    11/2008

OTHER PUBLICATIONS

Notification of Reason(s) for Rejection dated Dispatched Jan. 7, 2014 for Japanese Patent Appln. No. 2011-547037.

* cited by examiner

*Primary Examiner* — Dah-Wei D Yuan
*Assistant Examiner* — Binu Thomas
(74) *Attorney, Agent, or Firm* — Buchanan Ingersoll & Rooney PC

(57) ABSTRACT

An aspect of the present invention is drawn to a device for use with an electrostatic chuck having a top surface and a bottom surface, the top surface being separated from the bottom surface by a width, the electrostatic chuck additionally having a hole therein, the hole having a first width at the top surface and having a second width at the bottom surface, the first width being less than the second width, the top surface being capable of having wafer disposed thereon. The device includes a pin, a shaft, a neck portion and an outer housing portion. The pin has a pin width less than the first width. The shaft has a pin-holding portion, an end portion and a central portion disposed between the pin-holding portion and the end portion. The central portion has a first bearing portion. The outer housing portion has a first end and a second end and includes a second bearing portion. The shaft is disposed within the outer housing portion and is moveable relative to the outer housing portion. The neck portion is disposed at the first end. The second bearing portion is stationary relative to the neck portion. The first bearing portion is movable relative to the second bearing portion.

10 Claims, 9 Drawing Sheets

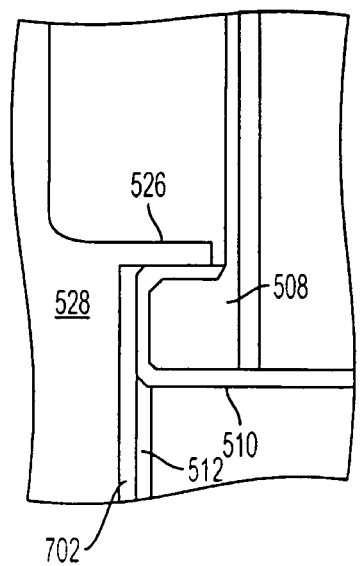
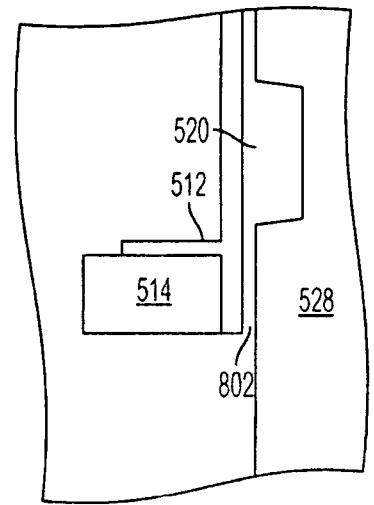
FIG. 7　　　　　　　　FIG. 8
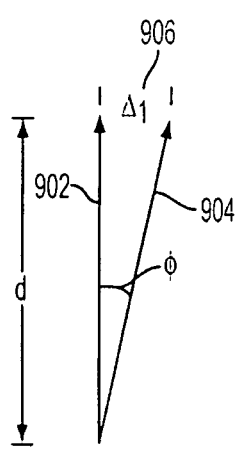
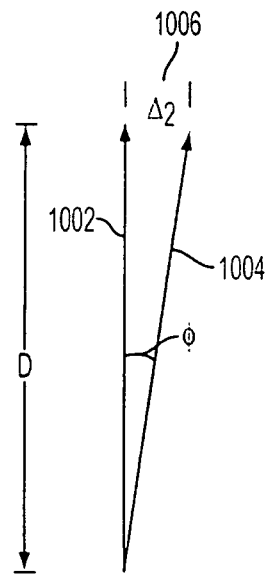
FIG. 9　　　　　　　　FIG. 10

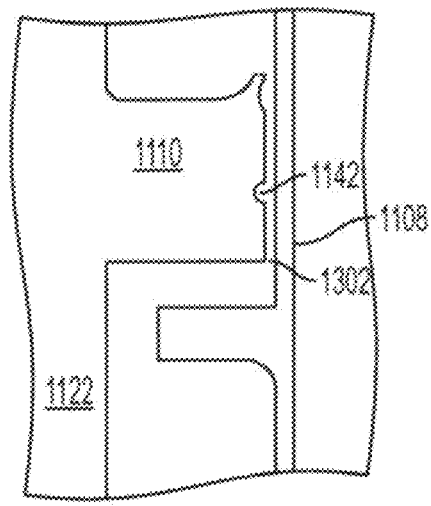
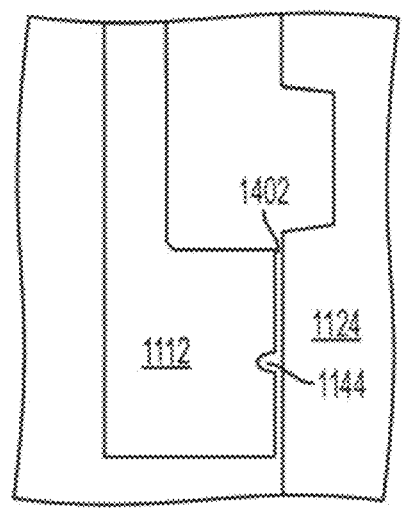
FIG. 13    FIG. 14
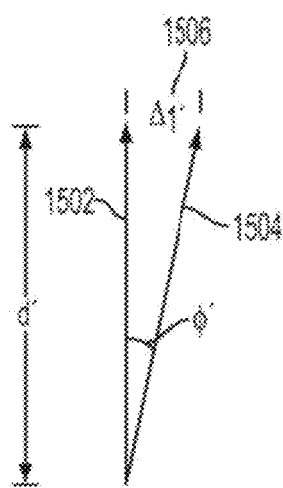
FIG. 15

PIN LIFTING SYSTEM

BACKGROUND

Semiconductor wafers are processed in wafer processing systems. An example conventional wafer processing system will now be described with reference to FIGS. 1 and 2.

FIGS. 1 and 2 illustrate a conventional wafer processing system. In the figures, wafer processing system 100 includes a confinement chamber portion 102, an electrode 104, an electrostatic chuck (ESC) 106, an electrode driving source 112, an ESC driving source 114 and a pin lifting system 116. Confinement chamber portion 102 has an input portion 108 and an output portion 110. Pin lifting system 116 includes a lifting pin 118. Confinement chamber portion 102 surrounds a processing space 122 used to process a semiconductor wafer 120.

In operation, as illustrated in FIG. 1, semiconductor wafer 120 is disposed onto ESC 106. ESC driving source 114 applies a voltage to ESC 106, thereby creating an electric field, which creates a Coulomb force that holds semiconductor wafer 120 onto ESC 106. While semiconductor wafer 120 is held in place by ESC 106, a plurality of materials may be supplied to processing space 122 via input portion 108, while a voltage is applied to electrode 104 via electrode driving source 112 to create plasma within processing space 122. The created plasma within processing space interacts with semiconductor wafer 120, either by etching portions of semiconductor wafer 120, or by depositing material onto semiconductor wafer 120. When the process is complete, the remaining material within processing space 122 is removed via output portion 110. Second driving source 114 then stops applying a voltage to ESC 106, which terminates the Coulomb force, which then releases semiconductor wafer 120. As illustrated in FIG. 2, pin lifting system 116 then pushes up on semiconductor wafer 120 to relieve the surface tension, lifting one edge of semiconductor wafer 120 off of ESC 106. Semiconductor wafer 120 is then removed from wafer processing system 100.

Great care must be taken in both construction and utilization of wafer processing system 100 in order to maintain the precision required in all aspects of semiconductor wafer processing. ESC 106, in particular is a very expensive portion of wafer processing system 100. The operational parameters of ESC 106 must be precisely maintained in order to accurately hold and release semiconductor wafers. Non-limiting examples of operational parameters of ESC 106 include surface resistance, surface capacitance and overall impedance, each of which may be changed as a result to changes, or damage, to the physical integrity of ESC 106. As such, ESC 106 may not function efficiently, or even at all, if its physical integrity is degraded.

ESC 106 is specifically susceptible to damage from lifting pin 118, as will be described below with respect to FIGS. 3 and 4.

FIG. 3 is an exploded view of portion A of FIG. 1. In FIG. 3, lifting pin 118 is separated from the inner wall of ESC 106 by a radial distance 302. The separation is needed to eliminate contact between lifting pin 118 and ESC 106 thereby preventing damage to ESC 106 from lifting pin 118.

FIG. 4 is an exploded view of an example situation of portion A, when lifting pin 118 is moved closer to semiconductor wafer 120. In the figure, the longitudinal axis of lifting pin 118 should align perpendicularly with ESC 106, along line 402. However, in this example situation, the longitudinal axis of lifting pin 118 is actually aligned along line 404, which is separated from the axis along line 402 by an angle θ.

Because the longitudinal axis of lifting pin 118 is aligned along line 404, when lifting pin 118 moves close to semiconductor wafer 120, lifting pin 118 contacts ESC 106 at point 406. As lifting pin 118 continues to rise toward semiconductor wafer 120, pin continues to scrape against ESC 106. Such scraping may damage ESC 106, which may change the physical integrity of ESC 106, which may change operational parameters of ESC 106, and which may result in ESC 106 functioning inefficiently or improperly. In such an event, ESC 106 must be repaired or replaced, either of which is costly.

A more detailed description of a conventional pin lifting system will now be described with reference to FIGS. 5 and 6.

FIG. 5 illustrates conventional pin lifting system 116 in a first state. As seen in the figure, pin lifting system 116 includes lifting pin 118, a pin holding shaft 504, a housing neck 506, a housing outer portion 508, a first bearing 510, a bearing separating portion 512, a second bearing 514 and a bellows portion 516. Bearing separating portion 512 separates first bearing 510 from second bearing 514 and additionally has a window 518 cut therein. Window 518 enables a lifting arm (not shown) to lift pin holding shaft 504 via notch 520. Pin holding shaft 504 includes a pin holding portion 522, an intermediate portion 524, a seat portion 526 and an end portion 528, which includes notch 520. Housing neck 506 includes a shaft guiding portion 532, a cap portion 534 and an inner portion 536. Housing outer portion 508 includes a lip portion 530.

Pin lifting system 116 is mountable into ESC 106 in a mounting hole 540. Mounting hole 540 includes a neck portion 542, a pin portion 544 and pin opening 546 at the top surface of ESC 106. Neck portion 542 is designed to pass lifting pin 118 and to retain shaft guiding portion 532. Pin portion 544 is operable to pass lifting pin 118, whereas pin opening 546 is designed to pass the tip of lifting pin 118. A fastening plate 548 retains pin lifting system 116 within mounting hole 540.

Cap portion 534 is connected to housing outer portion 508. One end of bellows portion 516 is connected to inner portion 536 of housing neck 506, whereas the other end of bellows portion 516 is connected to seat portion 526. First bearing 510 is connected to lip portion 530 of housing outer portion 508, and is additionally connected to bearing separating portion 512. Bearing separating portion 512 is additionally connected to second bearing 514. As such, first bearing 510 remains a constant distance d from second bearing 514.

In this state, lifting pin 118 is disposed below the top surface of ESC 106. As such, there is a space 538 between the top of pin holding portion 522 and shaft guiding portion 532.

A second state, a wafer-lifting state, of pin lifting system 116 will now be described with reference to FIG. 6.

To lift lifting pin 118 out through pin opening 546 of ESC 106, a lifting arm (not shown) engages and pin holding shaft 504 through window 518 at notch 520. Pin holding shaft 504 is continually lifted until seat portion 526 is separated from first bearing 510 and the top of pin holding portion 522 reaches the top of shaft guiding portion 532.

The problem of a lifting pin damaging an ESC, for example as discussed above with respect to FIG. 4, will now be described as applied to pin lifting system 116, with reference to FIGS. 7-10.

FIG. 7 is an exploded view of portion B of FIG. 5. In the figure, end portion 528 of pin holding shaft 504 does not actually touch first bearing 510. End portion 528 is spaced a distance 702 from first bearing 510. Pin lifting system 116 is designed in this manner to provide friction free movement along the axis parallel with the length of pin holding shaft 504.

FIG. 8 is an exploded view of portion C of FIG. 5. In the figure, end portion 528 of pin holding shaft 504 does not actually touch bearing separating portion 512. End portion 528 is spaced a distance 802 from bearing separating portion 512. Pin lifting system 116 is designed in this manner to provide friction-free movement along the axis parallel with the length of pin holding shaft 504.

The outer diameter of pin holding shaft 504 is conventionally designed to be as close to the inner diameter of each of first bearing 510 and bearing separating portion 512 to limit lateral movement of pin holding shaft 504. However, as discussed above, in order to provide friction-free movement of pin holding shaft 504, gaps still remain. These gaps may lead to a tilting of lifting pin 118, as will be described with reference to FIGS. 9 and 10 below.

Presume that arrow 902 of FIG. 9 represents the ideal longitudinal axis of pin holding shaft 504, wherein the longitudinal axis of lifting pin 118 is normal to the upper surface of ESC 106. In this example, further presume that pin holding shaft 504 is actually tilted such that end portion 528 touches bearing separating portion 512 at point 550, as illustrated in FIG. 5, whereas end portion 528 additionally touches first bearing 510 at point 552. In such a case, the longitudinal axis of pin holding shaft 504 actually is parallel with arrow 904 of FIG. 9. In this example, therefore, pin holding shaft 504 is tilted by an angle $\phi$.

As discussed above, the distance d is the distance between first bearing 510 second bearing 514. The spacing $\Delta_1$ 906 is the spacing between end portion 528 and first bearing 510, which is additionally illustrated as distance 702 in FIG. 7. As such, in FIG. 9, distance d and spacing $\Delta_1$ 906 are related to angle $\phi$ as:

$$\cos \phi = \Delta_1 / d. \quad (1)$$

Therefore, with a known distance d and spacing $\Delta_1$ 906, the maximum tilt angle $\phi$ of pin holding shaft 504 may be calculated.

Once the maximum tilt angle $\phi$ of pin holding shaft 504 is calculated, the maximum, unwanted, lateral displacement of lifting pin 118 may be determined. Returning to FIG. 5, distance D is the distance from the upper surface of ESC 106 to point 550, where end portion 528 touches bearing separating portion 512. Using maximum tilt angle $\phi$ of pin holding shaft 504 and the distance D, the maximum lateral displacement of lifting pin 118 may be determined.

As illustrated in FIG. 10, presume that arrow 1002 represents the ideal longitudinal axis of pin holding shaft 504, wherein the longitudinal axis of lifting pin 118 is normal to the upper surface of ESC 106. In this example, further presume that pin holding shaft 504 is tilted the maximum tilt angle $\phi$. In such a case, the longitudinal axis of pin holding shaft 504 actually is parallel with arrow 1004 of FIG. 10. Further, the maximum lateral displacement of lifting pin 118 is $\Delta_2$ 1006. As such, distance D and maximum tilt angle $\phi$ are related to $\Delta_2$ 1006 as:

$$\Delta_2 = D \cos \phi. \quad (2)$$

Therefore, with a known distance D and known maximum tilt angle $\phi$, spacing $\Delta_2$ 1006 may be calculated.

Plugging equation (1) into equation (2), yields:

$$\Delta_2 = (D/d)\Delta_1. \quad (3)$$

Therefore, it is clear that the maximum lateral displacement $\Delta_2$ of lifting pin 118 is directly related to the proportion of the distance D from the upper surface of ESC 106 to point 550 to the distance d between first bearing 510 second bearing 514.

As an example, presume that in a conventional pin lifting system, the distance d between first bearing 510 second bearing 514 is 1.2 cm, the distance D from the upper surface of ESC 106 to point 550 is 4.4 cm and the spacing $\Delta_1$ between end portion 528 and first bearing 510 is 1.4 mm. In such an example, the proportion of the distance D from the upper surface of ESC 106 to point 550 to the distance d between first bearing 510 second bearing 514 is 3.6. Using equation (3), the maximum lateral displacement $\Delta_2$ of lifting pin 118 is calculated to be 5.1 mm. In other words, lifting pin 118 has 5.1 mm of unwanted lateral play, with which lifting pin 118 may contact and damage ESC 106.

What is needed is a pin lifting system that decreases the lateral displacement of the pin.

BRIEF SUMMARY

It is an object of the present invention to provide a pin lifting system that decreases the lateral displacement of the pin.

An aspect of the present invention is drawn to a device for use with an electrostatic chuck having a top surface and a bottom surface, the top surface being separated from the bottom surface by a width, the electrostatic chuck additionally having a hole therein, the hole having a first width at the top surface and having a second width at the bottom surface, the first width being less than the second width, the top surface being capable of having wafer disposed thereon. The device includes a pin, a shaft, a neck portion and an outer housing portion. The pin has a pin width less than the first width. The shaft has a pin-holding portion, an end portion and a central portion disposed between the pin-holding portion and the end portion. The central portion has a first bearing portion. The outer housing portion has a first end and a second end and includes a second bearing portion. The shaft is disposed within the outer housing portion and is moveable relative to the outer housing portion. The neck portion is disposed at the first end. The second bearing portion is stationary relative to the neck portion. The first bearing portion is movable relative to the second bearing portion.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 7 is an exploded view of portion B of FIG. 5;

FIG. 8 is an exploded view of portion C of FIG. 5;

FIG. 9 illustrates a relationship between an ideal orientation of a pin holding shaft of the conventional pin lifting system of FIG. 5 when in the first state and an actual orientation of the pin holding shaft when tilted in the first state;

FIG. 10 illustrates a relationship between an ideal orientation of a pin holding shaft of the conventional pin lifting system of FIG. 6 when in the second state and an actual orientation of the pin holding shaft when tilted in the second state;

FIG. 13 is an exploded view of portion D of FIG. 11;

FIG. 14 is an exploded view of portion E of FIG. 11;

FIG. 15 illustrates a relationship between an ideal longitudinal axis of a pin holding shaft of pin lifting system of FIG. 11 when in the first state and an actual longitudinal axis of the pin holding shaft when tilted in the first state;

DETAILED DESCRIPTION

An example embodiment of a pin lifting system in accordance with an aspect of the present invention will now be described with reference to FIGS. 11 and 12.

Figure 11:
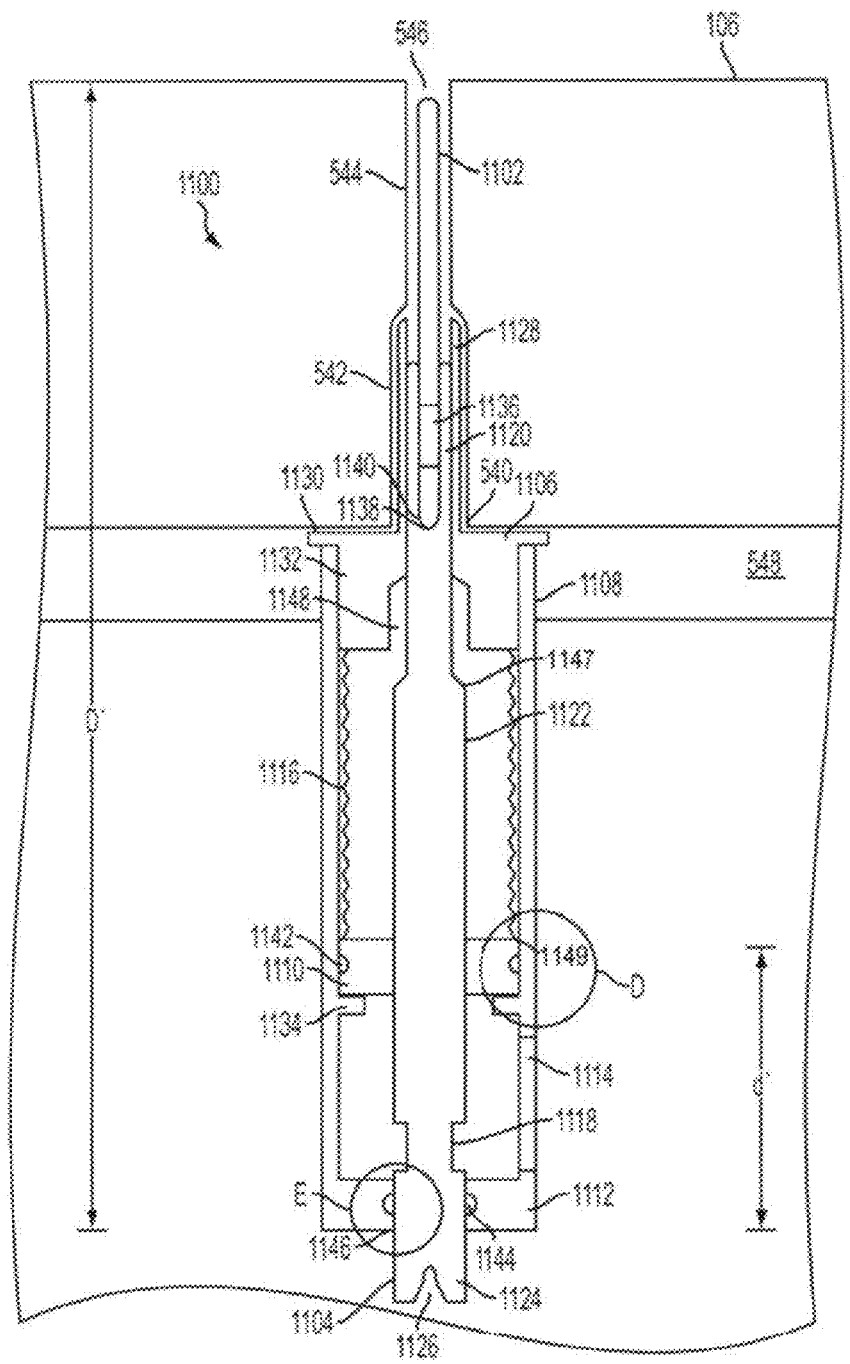
FIG. 11 illustrates an example pin lifting system, in a first state, in accordance with an aspect of the present invention.
Figure 12:
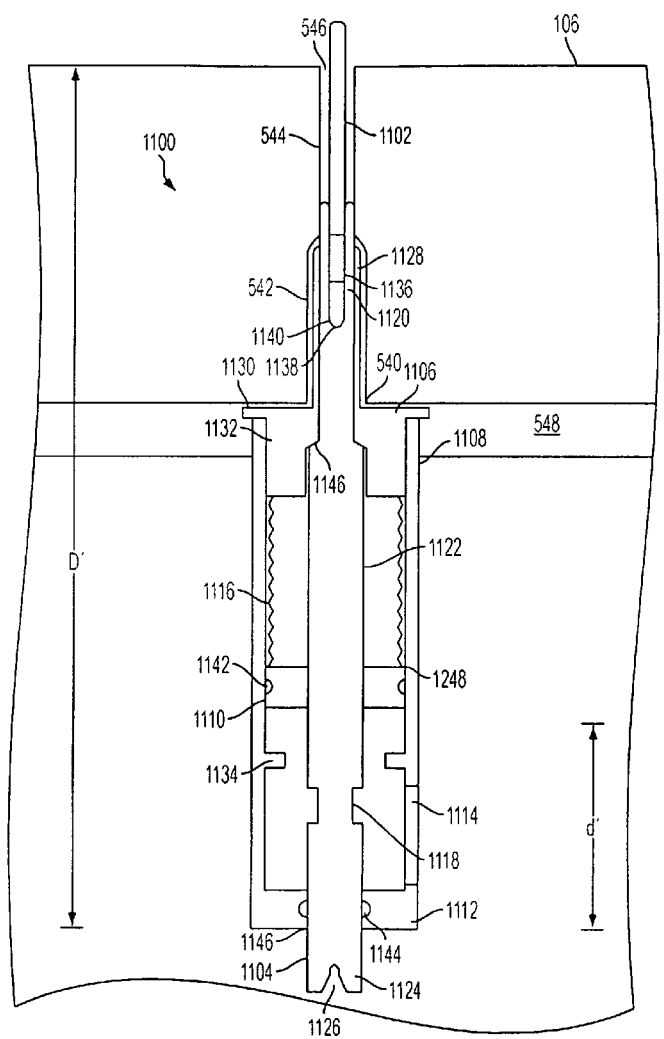
FIG. 12 illustrates the example pin lifting system of FIG. 11, in a second state, in accordance with an aspect of the present invention.

FIG. 11 illustrates an example pin lifting system 1100, in a first state, in accordance with an aspect of the present invention. As seen in the figure, pin lifting system 1100 includes a pin 1102, a pin retaining spring 1136, a pin holding shaft 1104, a housing neck 1106, a housing outer portion 1108 that includes a second bearing portion 1112, a first bearing 1110 and a bellows portion 1116. Housing outer portion 1108 has a window 1114 cut therein. Window 1114 enables a lifting arm (not shown) to lift pin holding shaft 1104 via a notch 1118. Pin holding shaft 1104 includes a pin holding portion 1120; an intermediate portion 1122 that includes a tapered portion 1147, and an end portion 1124, which includes an indentation 1126 and notch 1118. Housing neck 1106 includes a shaft guiding portion 1128, a cap portion 1130 and an inner portion 1132 that is shaped to have a cavity 1148. Housing outer portion 1108 includes a lip portion 1134.

Pin lifting system 1100 is mountable into ESC 106 in mounting hole 540. Neck portion 542 is designed to pass pin 1102 and to retain shaft guiding portion 1128. Pin portion 544 is operable to pass pin 1102, whereas pin opening 546 is designed to pass the tip of pin 1102.

Pin holding portion 1120 has a channel therein, for holding pin 1102. A radial force providing device, such as a pin retaining spring 1136, is annularly disposed around pin 1102 and within pin holding portion 1120. Pin retaining spring 1136 provides a radial force between the circumference of pin 1102 and the inner circumference of pin holding portion 1120. This radial force centers pin 1102 within pin holding portion 1120.

The bottom 1138 of pin 1102 may be designed to have a male geometry, whereas the bottom of pin holding portion 1120, or pin seat 1140, may be designed to have a corresponding female geometry. A non-limiting example of a male geometry of pin bottom 1138 includes a semi-spherical convex male geometry, whereas a non-limiting example of a female geometry of pin seat 1140 includes a semi-spherical concave female geometry. This geometric relationship between pin bottom 1138 and pin seat 1140 provides additional centering of pin 1102.

Cap portion 1130 is connected to housing outer portion 1108. One end of bellows portion 1116 is connected to inner portion 1132 of housing neck 1106, whereas the other end of bellows portion 1116 is connected to first bearing 1110. First bearing 1110 is additionally connected to intermediate portion 1122 of pin holding shaft 1104. As will be discussed further below, and in contrast to conventional pin lifting systems as discussed above, first bearing 1110 does not remain at a constant distance d from second bearing portion 1112. In accordance with an aspect of the present invention, first bearing 1110 is movable relative to second bearing portion 1112.

In this state, pin 1102 is disposed below the top surface of ESC 106.

A second state, a wafer-lifting state, of pin lifting system 1100 will now be described with reference to FIG. 12.

To lift pin 1102 out through pin opening 546 of ESC 106, a lifting arm (not shown) engages and pin holding shaft 1104 through window 1114 at notch 1118. Pin holding shaft 1104 is continually lifted until first bearing 1110 is separated from lip portion 1134 and tapered portion 1147 of intermediate portion 1122 of pin holding shaft 1104 fits into neck cavity 1148.

FIG. 13 is an exploded view of portion D of FIG. 11. In the figure, first bearing 1110 does not actually touch housing outer portion 1108. First bearing 1110 is spaced a distance 1302 from housing outer portion 1108. Pin lifting system 1100 is designed in this manner to provide friction free movement along the axis parallel with the length of pin holding shaft 1104. First bearing 1110 may additionally be designed to include an annular space 1142, which may be filled with lubricant to reduce friction in the event first bearing 1110 contacts housing outer portion 1108.

FIG. 14 is an exploded view of portion E of FIG. 11. In the figure, end portion 1124 of pin holding shaft 1104 does not actually touch second bearing portion 1112. End portion 1124 is spaced a distance 1402 from second bearing portion 1112. Pin lifting system 1100 is designed in this manner to provide friction-free movement along the axis parallel with the length of pin holding shaft 1104. Second bearing portion 1112 may additionally be designed to include an annular space 1144, which may be filled with lubricant to reduce friction in the event end portion 1124 contacts second bearing portion 1112.

The outer diameter of pin holding shaft 1104 is designed to be as close to the inner diameter of second bearing portion 1112 and the outer diameter of first bearing 1110 is designed to be as close to the inner diameter of outer housing portion 1108 to limit lateral movement of pin holding shaft 1104. However, as discussed above, in order to provide friction-free movement of pin holding shaft 1104, gaps still remain. These gaps lead to a tilting of pin 1102, as discussed below with reference to FIGS. 15 and 16.

In a first state, the pin in a pin lifting system is disposed below the surface of the ESC. Using the example embodiment pin lifting system 1100, presume that arrow 1502 of FIG. 15 represents the ideal longitudinal axis of pin holding shaft 1104, wherein the longitudinal axis of pin 1102 is normal to the upper surface of ESC 106. In this example, further presume that pin holding shaft 1104 is tilted such that end portion 1124 touches second bearing portion 1112 at point 1146, as illustrated in FIG. 11, whereas first bearing 1110 touches outer housing portion 1108 at point 1149. In such a case, the longitudinal axis of pin holding shaft 1104 actually is parallel with arrow 1504 of FIG. 15. In this example, therefore, pin holding shaft 1104 is tilted by an angle φ'.

In this example, let d' be the distance between first bearing 1110 and second bearing portion 1112, when pin lifting system 1100 is in the first state. The spacing $\Delta_1'$ 1506 is the spacing between first bearing 1110 and outer housing portion 1108, which is additionally illustrated as distance 1302 in FIG. 13. As such, in FIG. 15, distance d' and spacing $\Delta_1'$ 1506 are related to angle φ' as:

$$\cos \phi' = \Delta_1'/d'. \quad (4)$$

Therefore, with a known distance d' and spacing $\Delta_1'$ 1506, an initial maximum tilt angle φ' of pin holding shaft 1104 may be calculated.

Figure 1:
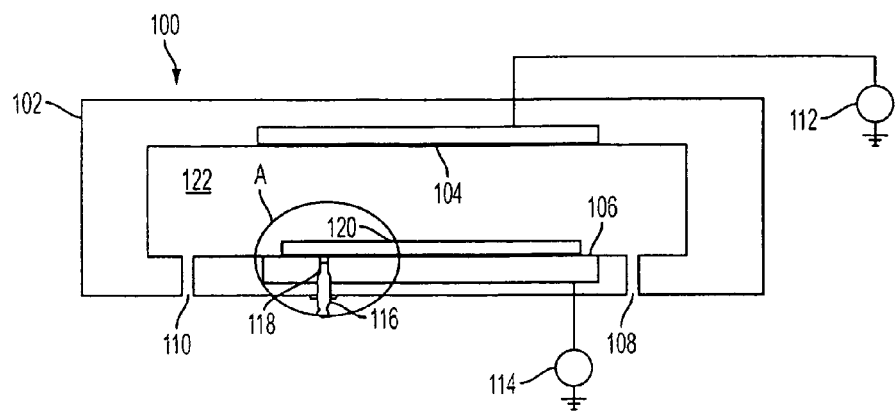
FIG. 1 illustrates a conventional wafer processing system in a first state when a wafer-lifting pin is below the surface of an ESC.
Figure 2:
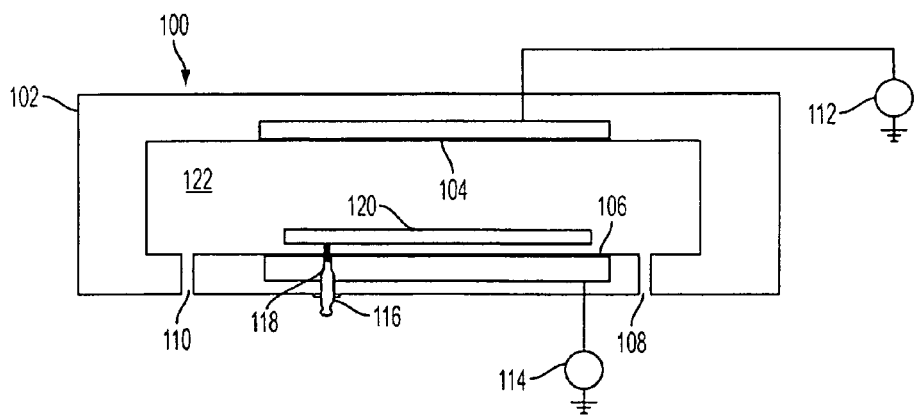
FIG. 2 illustrates the conventional wafer processing system in a second state when the wafer-lifting pin is above the surface of the ESC.
Figure 3:
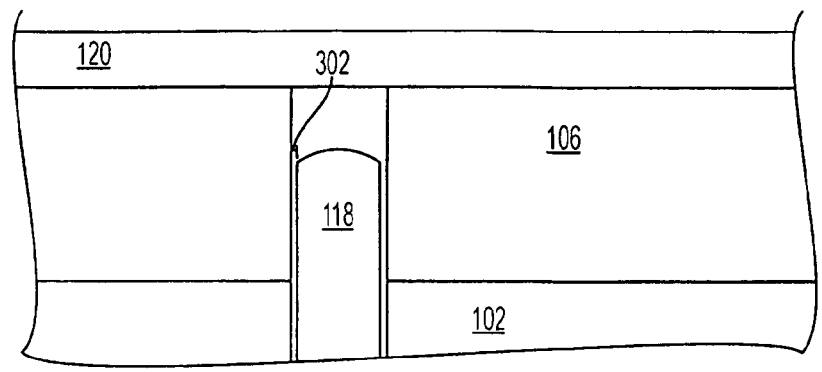
FIG. 3 is an exploded view of portion A of FIG. 1.
Figure 4:
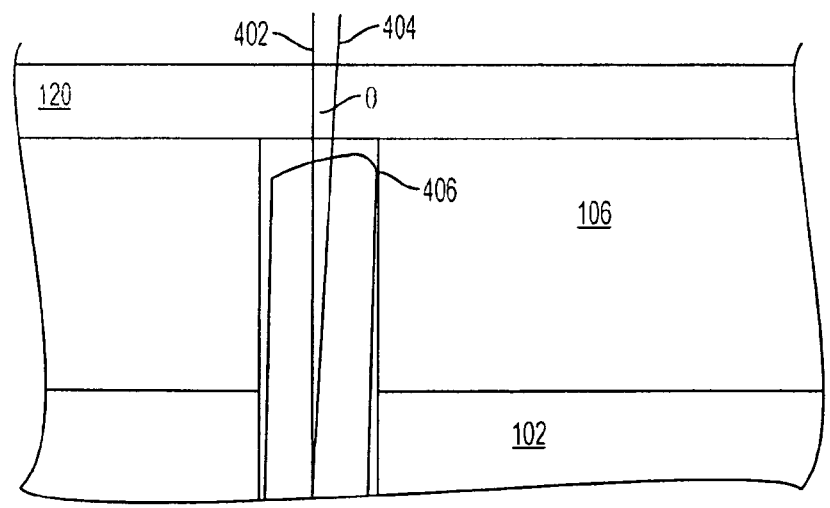
FIG. 4 is an exploded view of an example situation of portion A, when the pin is moved closer to semiconductor wafer.
Figure 5:
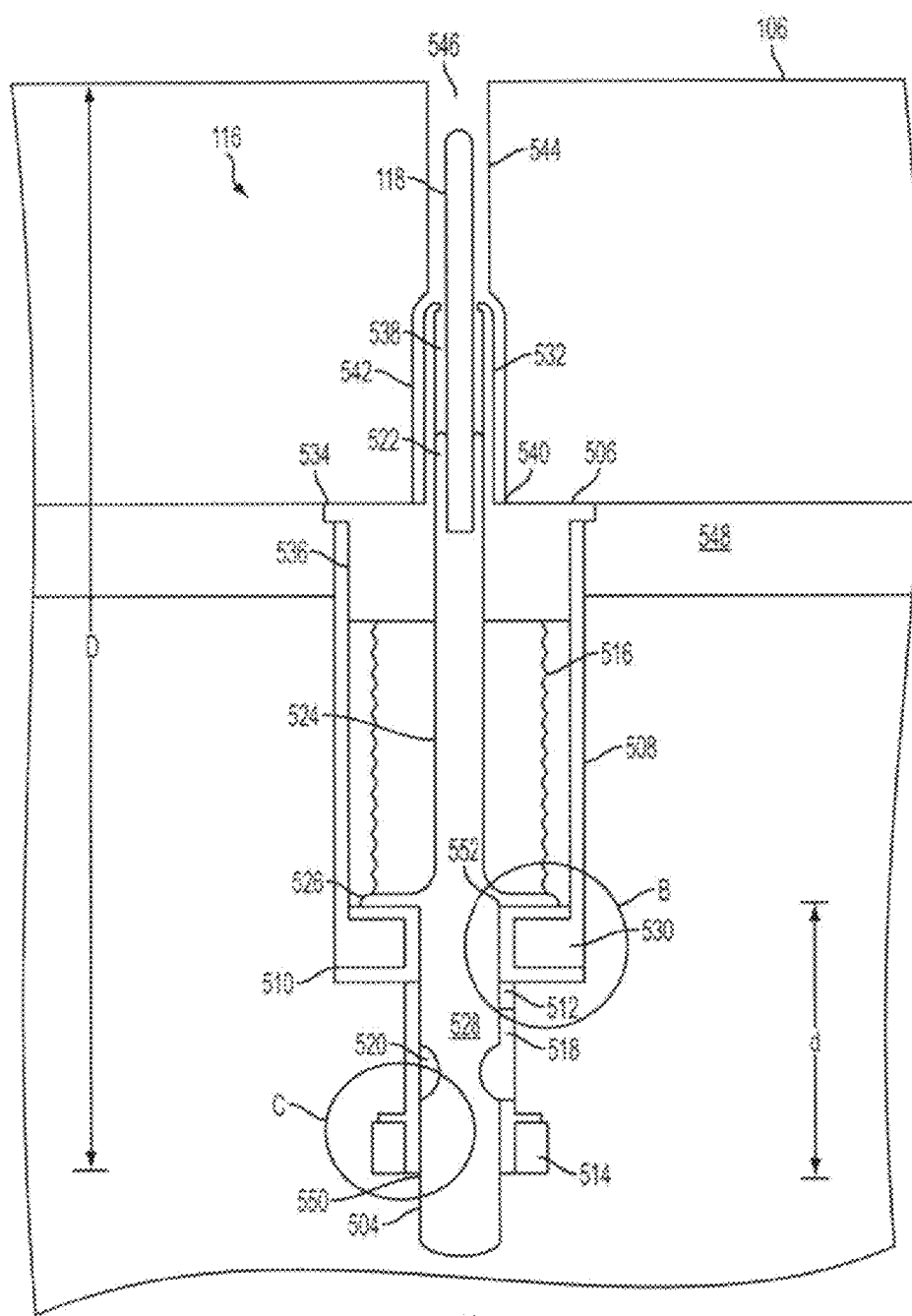
FIG. 5 illustrates a conventional pin lifting system in a first state.
Figure 6:
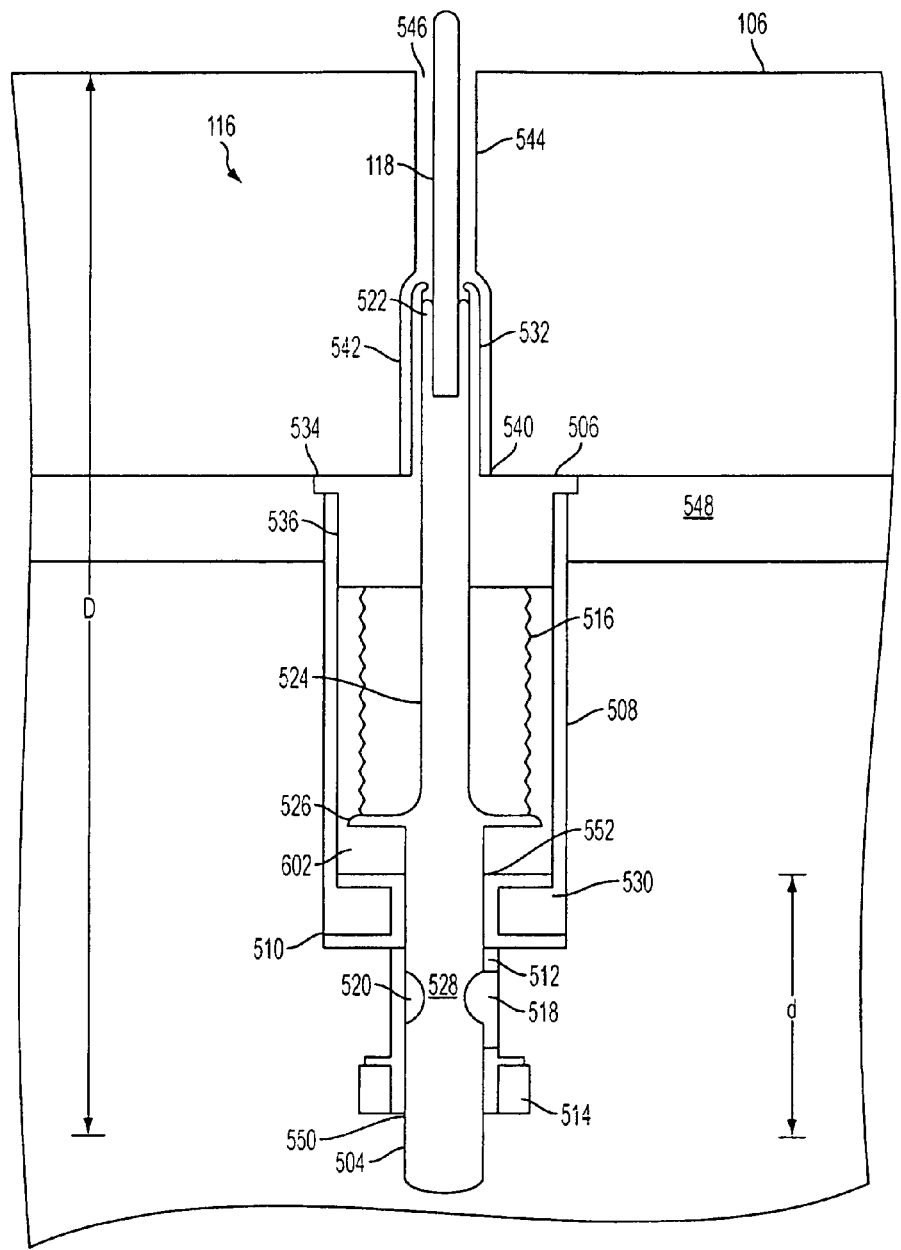
FIG. 6 illustrates a conventional pin lifting system in a second state.

Unlike the conventional pin lifting system discussed above with respect to FIGS. 5 and 6, in a pin lifting system in accordance with an aspect of the present invention, the tilt angle of the pin holding shaft does not remain constant. In particular, and as will be described in more detail below, in a pin lifting system in accordance with an aspect of the present invention, the distance between the first bearing and the second bearing portion does not remain constant. As such, the initial maximum tilt angle φ' of pin holding shaft 1104, which corresponds to the pin lifting system being in a first state, will be greater than the final maximum tilt angle of pin holding shaft 1104, which corresponds to the pin lifting system being in a second state.

Figure 16:
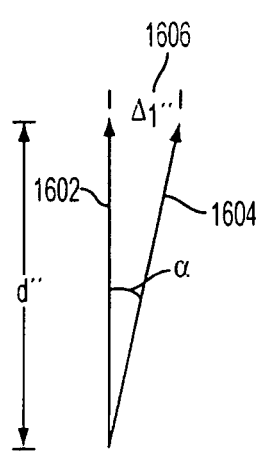
FIG. 16 illustrates a relationship between an ideal longitudinal axis of a pin holding shaft of pin lifting system of FIG. 12 when in the second state and an actual longitudinal axis of the pin holding shaft when tilted in the second state.

In a second state, the pin in a pin lifting system is disposed above the surface of the ESC. Using the example embodiment pin lifting system 1100, presume that arrow 1602 of FIG. 16 represents the ideal longitudinal axis of pin holding shaft 1104, wherein the longitudinal axis of pin 1102 is normal to the upper surface of ESC 106. In this example, further presume that pin holding shaft 1104 is tilted such that end portion 1124 touches second bearing portion 1112 at point 1146, as illustrated in FIG. 12, whereas first bearing 1110 touches outer housing portion 1108 at point 1248. In such a case, the longitudinal axis of pin holding shaft 1104 actually is parallel with arrow 1604 of FIG. 16. In this example, therefore, pin holding shaft 1104 is tilted by an angle α.

In this example, let d" be the distance between first bearing 1110 and second bearing portion 1112, when pin lifting system 1100 is in the second state. The spacing $\Delta_1"$ 1606 is the spacing between first bearing 1110 and outer housing portion 1108. As such, in FIG. 16, distance d" and spacing $\Delta_1"$ 1606 are related to angle α as:

$$\cos \alpha = \Delta_1"/d". \quad (5)$$

Therefore, with a known distance d" and spacing $\Delta_1"$ 1606, a final maximum tilt angle α of pin holding shaft 1104 may be calculated.

Once the final maximum tilt angle α of pin holding shaft 1104 is calculated, the maximum, unwanted, lateral displacement of pin 1102, when pin lifting system 1100 is in the second state, may be determined. Returning to FIG. 12, distance D" is the distance from the upper surface of ESC 106 to point 1146, where end portion 1124 touches second bearing portion 1112. Using maximum tilt angle α of pin holding shaft 1104 and the distance D", the maximum lateral displacement of pin 1102 may be determined.

Figure 17:
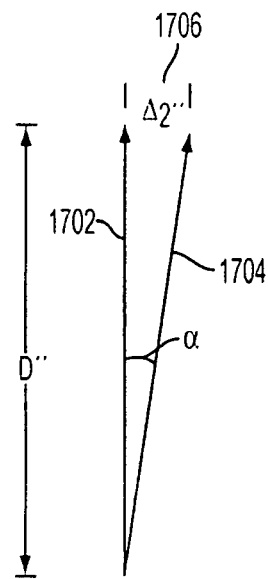
FIG. 17 illustrates a relationship between an ideal longitudinal axis of a pin holding shaft of pin lifting system of FIG. 12 when in the second state and an actual longitudinal axis of the pin holding shaft when tilted in the second state.

As illustrated in FIG. 17, when pin lifting system 1100 is in the second state, presume that arrow 1702 represents the ideal longitudinal axis of pin holding shaft 1104, wherein the longitudinal axis of pin 1102 is normal to the upper surface of ESC 106. In this example, further presume that pin holding shaft 1104 is tilted the maximum tilt angle α. In such a case, the longitudinal axis of pin holding shaft 1104 actually is parallel with arrow 1704 of FIG. 17. Further, the maximum lateral displacement of pin 1102 is $\Delta_2"$ 1706. As such, distance D" and maximum tilt angle α are related to $\Delta_2"$ 1706 as:

$$\Delta_2" = D" \cos \alpha. \quad (6)$$

Therefore, with a known distance D" and known maximum tilt angle α, spacing $\Delta_2"$ 1706 may be calculated.

Plugging equation (5) into equation (6), yields:

$$\Delta_2" = (D"/d")\Delta_1". \quad (7)$$

Therefore, when pin lifting system 1100 is in the second state, it is clear that the maximum lateral displacement $\Delta_2"$ of pin 1102 is directly related to the proportion of the distance D" from the upper surface of ESC 106 to point 1146 to the distance d" between first bearing 1110 and second bearing portion 1112.

As an example, presume that in a first state of an example pin lifting system in accordance with the present invention, the distance d' between first bearing 1110 second bearing portion 1112 is 1.2 cm and the spacing $\Delta_1'$ between first bearing 1110 and outer housing portion 1108 is 1.4 mm. In such an example, using equation (4) the initial maximum tilt angle φ' would be 1.8°.

However, when in the second state, the final maximum tilt angle α is smaller than the initial maximum tilt angle φ'.

Presume that in a second state of an example pin lifting system in accordance with the present invention, the distance d" between first bearing 1110 second bearing portion 1112 is now 2.0 cm because first bearing 1110 has moved relative to second bearing portion 1112. Further, presume that the distance D" from the upper surface of ESC 106 to point 1146 is 4.4 cm and the spacing $\Delta_1'$ between first bearing 1110 and outer housing portion 1108 remains 1.4 mm. In such a case, the proportion of the distance D" from the upper surface of ESC 106 to point 1112 to the distance d" between first bearing 1110 second bearing portion 1112 is 2.2. Using equation (7), the maximum lateral displacement $\Delta_2"$ of pin 1102, when pin lifting system 1100 is in the second state, is calculated to be 3.08 mm. In other words, pin 1102 has 3.08 mm of unwanted lateral play, with which pin 1102 may contact and damage ESC 106. This is a 40% decrease in lateral play over the conventional pin lifting system discussed above.

A pin lifting system in accordance with aspect of the present invention decreases the maximum lateral movement of the lifting pin, when the pin lifting system in is a state where the pin is close to the surface of the ESC. A radial force providing device within the pin holding portion of the pin holding shaft provides additional centering of the pin. Further, a collaboration of geometries of the bottom of the pin and the pin seat within the pin holding portion of the pin holding shaft provides addition centering of the pin. Finally, by varying the distance between a first bearing and a second bearing portion of the pin lifting system, the final maximum lateral movement of the lifting pin is decreased.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A device for use with an electrostatic chuck having a top surface and a bottom surface, the top surface being separated from the bottom surface by a width, the electrostatic chuck additionally having a hole therein, the hole having a first width at the top surface and having a second width at the bottom surface, the first width being less than the second width, the top surface being capable of having a wafer disposed thereon, said device comprising:
 a pin having a pin width less than the first width;
 a shaft having a pin-holding portion supporting a lower end of the pin, an end portion and a central portion disposed between said pin-holding portion and said end portion, said central portion comprising a first bearing portion; and
 an outer housing portion having a first end and a second end and comprising a second bearing portion,
 wherein said shaft is disposed within said outer housing portion and is moveable relative to said outer housing portion between a first position and a second position,
 wherein the outer housing portion surrounds the first bearing portion and the second bearing portion surrounds the shaft so as to limit lateral movement of the shaft when the shaft is moved relative to the outer housing portion,
 wherein said second bearing portion is stationary,
 wherein said first bearing portion is movable relative to said second bearing portion, and
 wherein the outer housing portion includes a lip portion wherein the first bearing portion separates from the lip portion when the shaft is moved into the second position;
 wherein the first bearing portion includes an annular space which is configured to be filled with lubricant so as to reduce friction between the first bearing portion and the outer housing portion when the shaft is moved between the first and second positions.

2. The device of claim 1,
 wherein said pin comprises a first pin end and a second pin end,
 wherein said first pin end is separated from said second pin end by a pin length,
 wherein said second pin end comprises a male geometry,
 wherein said pin-holding portion comprises a channel portion having an open end and a pin-holding bottom separated from said open end by a pin-holding length,
 wherein said pin-holding bottom comprises a female geometry, and
 wherein said pin is disposed in said pin-holding portion such that the second pin end rests on said pin-holding bottom.

3. The device of claim 2,
 wherein said second pin end comprises a semi-spherical convex male geometry
 wherein said pin-holding bottom comprises a semi-spherical concave female geometry.

4. The device of claim 2, further comprising a radial force-providing device disposed to surround said pin and disposed within said pin-holding portion, said radial force-providing device operable to provide a radial force between said pin-holding portion and said pin so as to center the pin within the pin-holding portion.

5. The device of claim 1,
 wherein said pin comprises a first pin end and a second pin end,
 wherein said first pin end is separated from said second pin end by a pin length,
 wherein when said shaft is disposed in the first position, the first pin end is disposed between the top surface and said second pin end and the first bearing portion is disposed a first bearing separation distance from said second bearing portion,
 wherein when said shaft is disposed in the second position, the top surface is disposed between said first pin end and said second pin end, and the first bearing portion is disposed a second bearing separation distance from said second bearing portion, and
 wherein the first bearing separation distance is greater than the second bearing separation distance.

6. The device of claim 1, further comprising a housing neck including a shaft guiding portion, a cap portion, and an inner portion having a cavity therein, wherein the cap portion is connected to the outer housing portion, the central portion of the shaft including a tapered portion wherein the tapered portion fits into the cavity when the shaft is moved into the second position.

7. The device of claim 1, wherein the second bearing portion includes an annular space which is configured to be filled with lubricant so as to reduce friction between the second bearing portion and the shaft when the shaft is moved between the first and second positions.

8. The device of claim 6, further including a bellows portion wherein an upper end of the bellows portion is connected to an inner portion of the housing neck and a lower end of the bellows portion is connected to the first bearing portion.

9. A device for use with an electrostatic chuck having a top surface and a bottom surface, the top surface being separated from the bottom surface by a width, the electrostatic chuck additionally having a hole therein, the hole having a first width at the top surface and having a second width at the bottom surface, the first width being less than the second width, the top surface being capable of having a wafer disposed thereon, said device comprising:
 a pin having a pin width less than the first width;
 a shaft having a pin-holding portion supporting a lower end of the pin, an end portion and a central portion disposed between said pin-holding portion and said end portion, said central portion comprising a first bearing portion; and
 an outer housing portion having a first end and a second end and comprising a second bearing portion,
 wherein said shaft is disposed within said outer housing portion and is moveable relative to said outer housing portion between a first position and a second position,
 wherein the outer housing portion surrounds the first bearing portion and the second bearing portion surrounds the shaft so as to limit lateral movement of the shaft when the shaft is moved relative to the outer housing portion,
 wherein said second bearing portion is stationary,
 wherein said first bearing portion is movable relative to said second bearing portion, and
 wherein the outer housing portion includes a lip portion wherein the first bearing portion separates from the lip portion when the shaft is moved into the second position;
 wherein the second bearing portion includes an annular space which is configured to be filled with lubricant so as to reduce friction between the second bearing portion and the shaft when the shaft is moved between the first and second positions.

10. A device for use with an electrostatic chuck having a top surface and a bottom surface, the top surface being separated from the bottom surface by a width, the electrostatic chuck additionally having a hole therein, the hole having a first width at the top surface and having a second width at the bottom surface, the first width being less than the second width, the top surface being capable of having a wafer disposed thereon, said device comprising:

a pin having a pin width less than the first width;

a shaft having a pin-holding portion supporting a lower end of the pin, an end portion and a central portion disposed between said pin-holding portion and said end portion, said central portion comprising a first bearing portion; and an outer housing portion having a first end and a second end and comprising a second bearing portion, wherein said shaft is disposed within said outer housing portion and is moveable relative to said outer housing portion between a first position and a second position, wherein the outer housing portion surrounds the first bearing portion and the second bearing portion surrounds the shaft so as to limit lateral movement of the shaft when the shaft is moved relative to the outer housing portion, wherein said second bearing portion is stationary, wherein said first bearing portion is movable relative to said second bearing portion, and wherein the outer housing portion includes a lip portion wherein the first bearing portion separates from the lip portion when the shaft is moved into the second position; and a housing neck including a shaft guiding portion, a cap portion, and an inner portion having a cavity therein, wherein the cap portion is connected to the outer housing portion, the central portion of the shaft including a tapered portion wherein the tapered portion fits into the cavity when the shaft is moved into the second position; and a bellows portion wherein an upper end of the bellows portion is connected to an inner portion of the housing neck and a lower end of the bellows portion is connected to the first bearing portion.

* * * * *